(12) United States Patent
Douskey et al.

(10) Patent No.: US 9,069,041 B2
(45) Date of Patent: Jun. 30, 2015

(54) SELF EVALUATION OF SYSTEM ON A CHIP WITH MULTIPLE CORES

(71) Applicant: International Business Machines Corporation, Armonk, NY (US)

(72) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 13/705,353

(22) Filed: Dec. 5, 2012

(65) Prior Publication Data

US 2014/0157072 A1    Jun. 5, 2014

(51) Int. Cl.
*G01R 31/28* (2006.01)
*G01R 31/317* (2006.01)
*G01R 31/3177* (2006.01)

(52) U.S. Cl.
CPC ...... *G01R 31/31703* (2013.01); *G01R 31/3177* (2013.01); *G01R 31/31718* (2013.01)

(58) Field of Classification Search
CPC ............................ G06F 11/27; G01R 31/8547
USPC ............................................ 714/732, 726, 28
See application file for complete search history.

(56) References Cited

U.S. PATENT DOCUMENTS

| 5,732,209 | A | | 3/1998 | Vigil et al. |
| 5,963,566 | A | * | 10/1999 | Rajsuman et al. ............ 714/733 |
| 6,158,029 | A | | 12/2000 | Richter et al. |
| 6,442,722 | B1 | | 8/2002 | Nadeau-Dostie et al. |
| 6,487,688 | B1 | | 11/2002 | Nadeau-Dostie |
| 6,564,348 | B1 | | 5/2003 | Barenys et al. |
| 6,614,263 | B2 | | 9/2003 | Nadeau-Dostie et al. |
| 6,763,485 | B2 | | 7/2004 | Whetsel |
| 7,127,640 | B2 | | 10/2006 | Parulkar et al. |
| 7,313,739 | B2 | | 12/2007 | Menon et al. |

(Continued)

OTHER PUBLICATIONS

Ebadi et al., "Time Domain Multiplexed TAM: Implementation and Comparison", Proceedings of the Design,Automation and Test in Europe Conference and Exhibition (Date'03), p. 732-737, IEEE Computer Society, 2003.

(Continued)

*Primary Examiner* — Fritz Alphonse
(74) *Attorney, Agent, or Firm* — Martin & Associates, LLC; Bret J. Petersen

(57) ABSTRACT

A method and structure tests a system on a chip (SoC) or other integrated circuit having multiple cores for chip characterization to produce a partial good status. A Self Evaluation Engine (SEE) on each core creates a quality metric or partial good value for the core. The SEE executes one or more tests to create a characterization signature for the core. The SEE then compares the characterization signature of a core with a characterization signature of neighboring cores to determine the partial good value for the core. The SEE may output a result to create a full characterization map for detailed diagnostics or a partial good map with values for all cores to produce a partial good status for the entire SoC.

19 Claims, 5 Drawing Sheets

(56) References Cited

U.S. PATENT DOCUMENTS

| | | | |
|---|---|---|---|
| 7,348,796 B2 * | 3/2008 | Crouch et al. | 326/38 |
| 7,484,144 B2 | 1/2009 | Han et al. | |
| 7,484,153 B2 | 1/2009 | Kiryu et al. | |
| 7,689,884 B2 | 3/2010 | Seuring | |
| 7,814,385 B2 | 10/2010 | Bahl | |
| 7,917,820 B1 | 3/2011 | Pavie et al. | |
| 8,046,643 B2 | 10/2011 | Andreev et al. | |
| 8,046,655 B2 | 10/2011 | Dubey | |
| 8,122,312 B2 | 2/2012 | Floyd et al. | |
| 8,156,391 B2 | 4/2012 | Andreev et al. | |
| 8,248,073 B2 * | 8/2012 | Inoue et al. | 324/322 |
| 2004/0003329 A1 * | 1/2004 | Cote et al. | 714/726 |
| 2006/0250864 A1 | 11/2006 | Hartmann | |
| 2008/0023700 A1 | 1/2008 | Gschwind | |
| 2008/0276144 A1 | 11/2008 | Huben et al. | |
| 2009/0089636 A1 | 4/2009 | Fernsler et al. | |
| 2012/0084603 A1 | 4/2012 | Riley | |

OTHER PUBLICATIONS

Apostolakis et al., "Exploiting Thread-Level Parallelism in Functional Self-Testing of CMT Processors", 2009 European Test Symposium, p. 33-38, IEEE Computer Society, 2009.

Lee et al., "On-Chip SOC Test Platform Design Based on IEEE 1500 Standard", IEEE Transactions on Very Large Scale Integration (VLSI) Systems, vol. 18, No. 7, p. 1134-1139, Jul. 2010.

Denq et al., "A Parallel Built-In Diagnostic Scheme for Multiple Embedded Memories", Records of the 2004 International Workshop on Memory Technology, Design and Testing (MTDT'04), p. 65-69, IEEE Computer Society, 2004.

International Search Report and Written Opinion of the ISA dated Mar. 13, 2014—International Application No. PCT/CN2013/087904.

* cited by examiner

SELF EVALUATION OF SYSTEM ON A CHIP WITH MULTIPLE CORES

BACKGROUND

1. Technical Field

This disclosure generally relates to testing and evaluation of electronic integrated circuits such as Application Specific Integrated Circuits (ASIC) and System-on-a-chip (SoC) designs, and more specifically relates to a method and apparatus for self evaluation of an integrated circuits such as an SoC or ASIC with multiple cores for Partial Good (PG) testing of the integrated circuit.

2. Background Art

Digital integrated circuits such as a system-on-a-chip (SoC) with ASIC or custom integrated circuit designs are becoming increasingly complex. SoC designs are including increasing numbers of microprocessor cores, some of which may be redundant for functional or manufacturing yield reasons. These multiple (microprocessor) cores are difficult to test and characterize as they are imbedded within the design. Multiple cores per die also increases manufacturing test time, complexity, and cost. As used herein, a "core" is a microcontroller, processor, digital signal processor (DSP) or other large block of circuitry that is replicated with a number of instances on an integrated circuit.

The testing of these devices is therefore becoming increasingly important. Testing of a device may be important at various stages, including in the design of the device, in the manufacturing of the device, and in the operation of the device. Testing during the manufacturing stage may be performed to ensure that the timing, proper operation and performance of the device are as expected. Ideally, it would be helpful to test the device for every possible defect. Because of the complexity of most devices, however, it is becoming prohibitively expensive to take the deterministic approach of testing every possible combination of inputs to each logic gate and states of the device. A more practical approach applies pseudorandom input test patterns to the inputs of the different logic gates. The outputs of the logic gates are then compared to the outputs generated by a "good" device (one that is known to operate properly) in response to the same pseudorandom input test patterns. The more input patterns that are tested, the higher the probability that the logic circuit being tested operates properly (assuming there are no differences between the results generated by the two devices.)

This non-deterministic approach can be implemented using built in test such as logic built-in self-test (LBIST) techniques. For example, one LBIST technique involves incorporating latches between portions of the logic being tested (the target logic,) loading these latches with pseudorandom bit patterns and then capturing the bit patterns that result from the propagation of the pseudorandom data through the target logic. Conventionally, the captured bit patterns are scanned out of the scan chains into a multiple-input signature register (MISR,) in which the bit patterns are combined with an existing signature value to produce a new signature value. This signature value can be examined (e.g., compared with the signature generated in a device that is known to operate properly) to determine whether or not the device under test functioned properly during the test.

In some devices, such as multiprocessor integrated circuits and SoC, the device may be considered to be "good," even if some portions of the device include defects. For instance, in a SoC having multiple cores, the SoC may still be functional if one or more of the cores is defective. This is called Partial Good (PG) or PG testing.

BRIEF SUMMARY

The disclosure and claims herein are directed to a method and structure to test a SoC or other integrated circuit having multiple cores for chip characterization or partial good status. A Self Evaluation Engine (SEE) on each core creates a quality metric or partial good value for the core. The SEE executes one or more tests to create a characterization signature for the core. The SEE then compares the characterization signature of a core with a characterization signature of neighboring cores to determine the partial good value for the core. The SEE may output a result to create a full characterization map for detailed diagnostics or a partial good map with values for all cores to produce a partial good status for the entire SoC.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

The disclosure and claims herein are directed to a method and structure to test a SoC or other integrated circuit having multiple cores for chip characterization or partial good status. A Self Evaluation Engine (SEE) on each core creates a quality metric or partial good value for the core. The SEE executes one or more tests to create a characterization signature for the core. The SEE then compares the characterization signature of a core with a characterization signature of neighboring cores to determine the partial good value for the core. The SEE may output a result to create a full characterization map for detailed diagnostics or a partial good map with values for all cores to produce a partial good status for the entire SoC.

Figure 1:
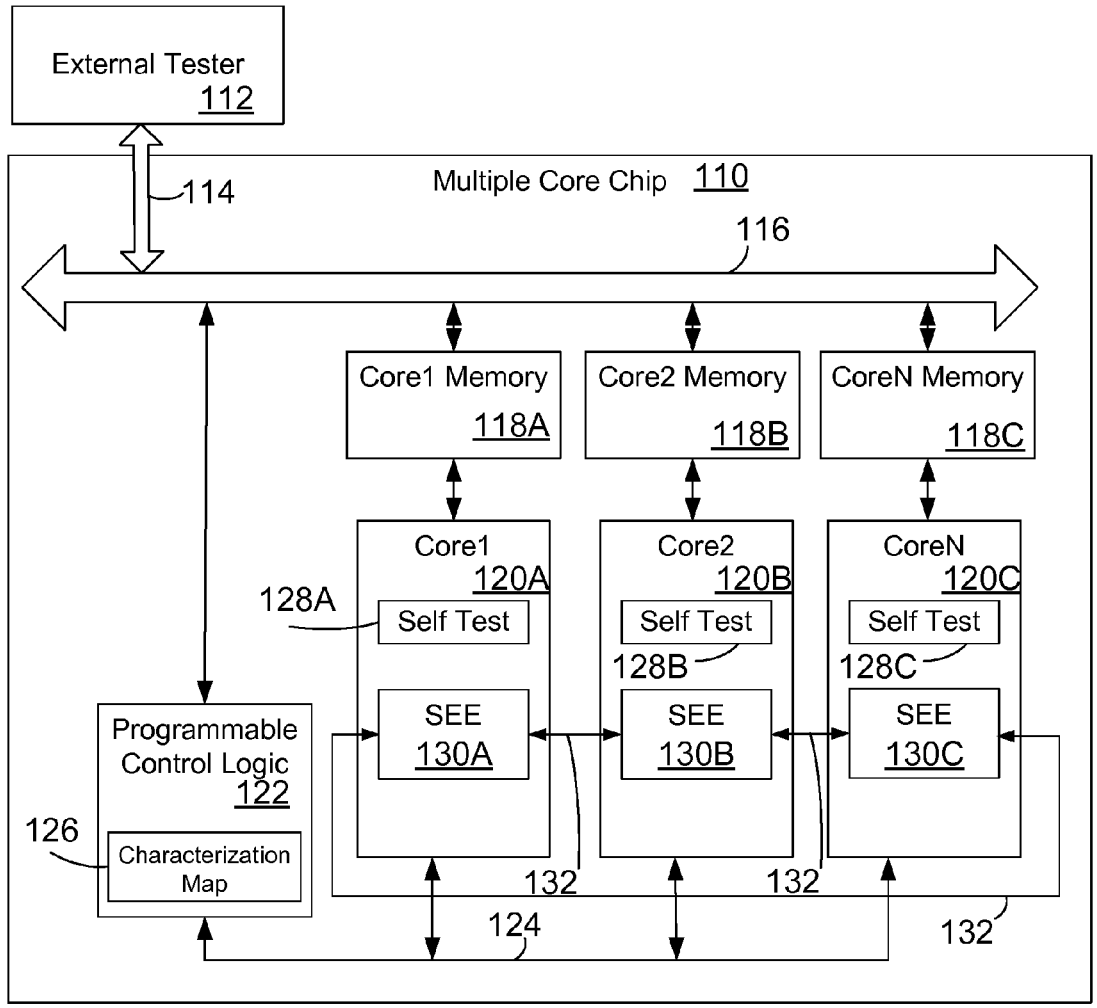
FIG. 1 is a block diagram of an apparatus for testing multiple cores on a SoC.

FIG. 1 is a block diagram illustrating an apparatus for testing multiple cores on a multiple core chip 110 that supports self evaluation. The multiple core chip 110 is connected to an external tester 112 through a testing interface 114 in a manner as know in the prior art. The external tester 112 may be a manufacturing tester, a lab environment or part of a full system that incorporates built in test of the multiple core chips. An internal bus 116 connects multiple core memories 118A, 118B, 118C to the internal bus 116. The core memories are then connected to the cores 120A, 120B, 120C. Alternatively the core memories 118A, 118B, 118C could be incorporated into the cores 120A, 120B, 120C. The cores 120A, 120B, 120C output a test result to programmable control logic 122 over connection 124 that connects each of the cores to the programmable control logic. The programmable control logic 122 can optionally accumulate the goodness values determined from the test results as described further below into a characterization map 126. The characterization map may reside in external tester 112. The characterization map preferably is a table that holds the gathered goodness values for all the cores determined locally by the individual SEEs in the cores. The partial good status may simply be a count of the number of good cores whether or not a characterization map is created.

The multiple core chip 110 illustrated in FIG. 1 shows only three cores 120A, 120B, 120C for simplicity of the drawing. It is understood that any number of cores could be included in the multiple core chip 110. Further, each core 120A, 120B, 120C includes a self test module 128A, 128B 128C. The self test modules perform one or more built in tests and provides a characterization signature of test results for the core to a Self Evaluation Engine (SEE) 130A, 130B, 130C located in each of the cores. The built in tests may be any appropriate test that provides a characterization signature such as a logic built-in self-test (LBIST) known in the prior art. The SEEs of each core connects to the SEE of neighboring cores in a loop connection 132 as shown. The loop connection 132 allows the SEE to share a local core signature with the SEE of the other cores as further discussed below.

Figure 2:
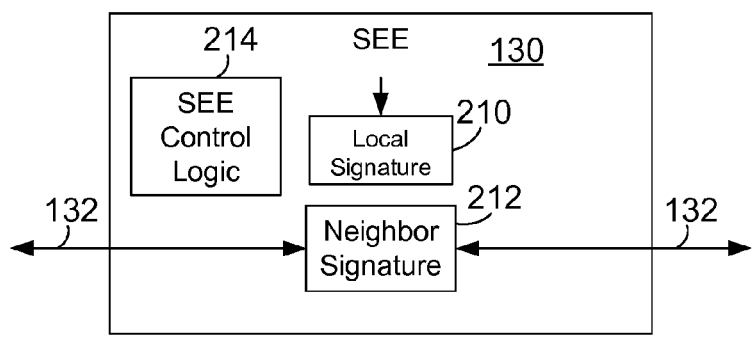
FIG. 2 illustrates a block diagram of a Signature Evaluation Engine (SEE) located in each core on a SoC.

FIG. 2 illustrates a block diagram of a SEE 130 located in each of the cores 120A, 120B, 120C of the multiple core chip 110. The SEE 130 includes a local signature 210 that is produced by the self test 128 (128A, 128B, 128C shown in FIG. 1) of the local core, meaning the core the SEE resides in. The SEE also includes at least one neighbor signature 212 that has been shifted into the SEE 130 from a neighboring SEE by the loop connection 132. The SEE further includes SEE control logic 214 that provides the control logic to make the comparisons and other operations of the SEE to evaluate the goodness of the local core associated with the SEE as described below. The SEE control logic may be any suitable form of logic such as combination logic or a state machine.

The external tester 112 in conjunction with the SEEs in each core test the cores in a manner known in the prior art to produce a signature that represents the state of the cores. The external tester may load a small program into a control core (not shown) and then allow the self test 128 to produce the local signature 210. The cores can concurrently run the self tests, and then each core compares their local signature with the signatures of neighboring cores to efficiently determine a partial good value for the local core. Various methods of comparing the signatures are described in the examples below.

Figure 3:
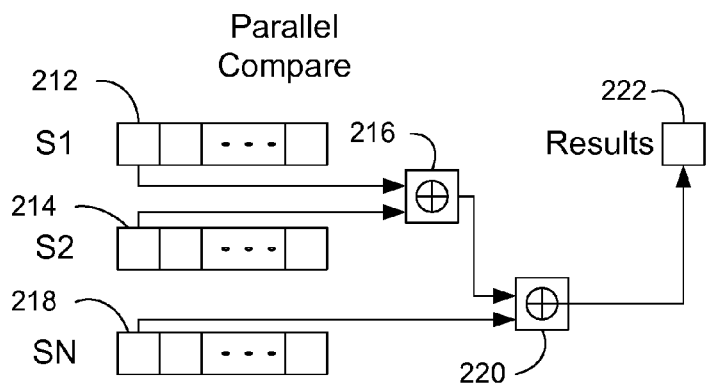
FIG. 3 illustrates a parallel compare for testing multiple cores on a SoC.

FIG. 3 illustrates a block diagram that represents an example of parallel compare for testing multiple cores on a SoC. The parallel compare illustrated in FIG. 3 is a highly simplified example. The block diagram shows a first bit 212 of signature S1 being compared to the first bit 214 of a second signature S2 with a first Exclusive OR 216. The first bit 218 of a third signature Sn is compared with the output of the first Exclusive OR 216 by a second Exclusive OR 220. The signature Sn represents that there can be any number of signatures n that represent the test results of the same number of n cores in the SoC. In this manner, a parallel compare of all the cores can be accomplished. The parallel compare has several limitations.

Figure 4:
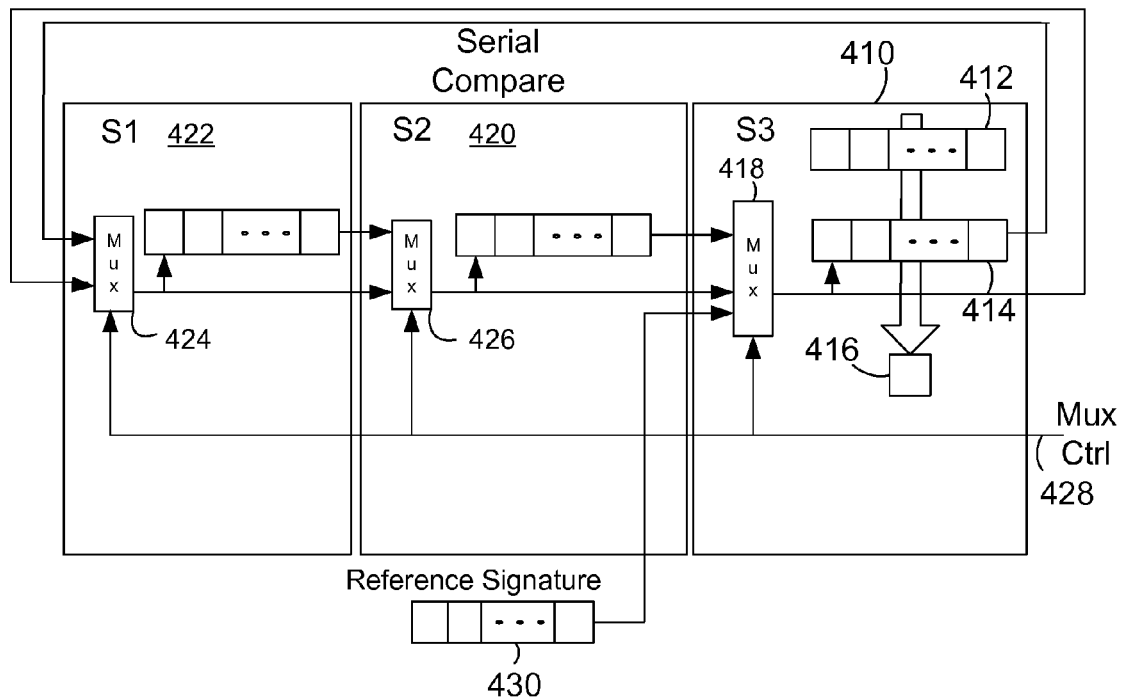
FIG. 4 illustrates a serial compare for testing multiple cores on a SoC.

FIG. 4 illustrates a block diagram that represents an example of serial compare for testing multiple cores on a SoC. The serial compare illustrated in FIG. 4 is a highly simplified example. In a serial compare, each of the cores are compared to one or more of their neighboring cores by serially shifting signatures from the neighboring cores. A full compare of signatures with all the other cores could also be done with the serial compare logic as described herein. In this example, Core S3 410 has a local signature 412 that can be compared to a neighbor signature 414 to produce a result 416. The neighbor signature 414 is serially shifted from a neighbor core through the multiplexor 418. The multiplexor 418 allows the core S3 to compare the local signature 412 to a local signature from the immediate neighbor S2 420 or the previous neighbor S1 422. Core S1 422 and core S2 420 are similarly connected with multiplexors 424, 426. The multiplexors are controlled by one or more multiplexor control signals 428 from the programmable control logic 122 in FIG. 1, or the SEE control logic 214 in FIG. 2. The multiplexors provide a bypass capability whereby the control logic can bypass comparing the local signature to some neighbors for a core centric compare as described further below. Optionally, a local signature can be compared to a reference signature 430. A local signature can be selected as a reference signature, or in a debug situation a user provided reference signature could be used. Comparing to a reference signature could be accomplished by providing a reference signature 430 to the multiplexor 418 so that the reference signature 430 can be serially loaded and compared to the local signature 412.

Figure 5:
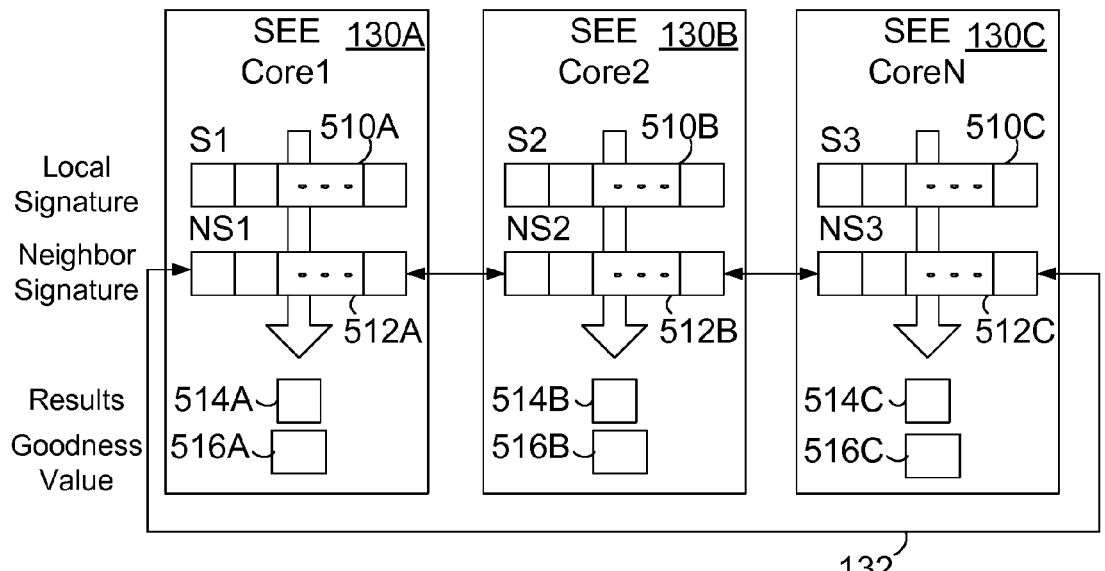
FIG. 5 illustrates an example of core centric compare for testing multiple cores on a SoC.

FIG. 5 illustrates a block diagram for an example of core centric compare for testing multiple cores on a SoC. Where a full compare is not needed, a Core Centric compare can be used. A core centric compare as used herein is specific type of serial compare introduced in FIG. 4. In core centric compare, local signatures of each core is compared to one or more neighbor cores in one or more passes. A core centric compare is one where the core acts independently of the other cores to determine its own goodness. In a core centric compare, the local core signature is compared using a selectable number of core comparisons (compare range) and a selectable number of passes to achieve a desired level of "goodness". The core centric compare may produce a partial goodness status for the SoC or integrated circuit with the multiple cores. The partial goodness status relates to the number of bad cores on an acceptable chip. The partial goodness status may be reflected with a number of bad cores, good cores or a ratio of good and bad cores. The partial good status may be determined from the partial good values from each core and optionally stored in the characterization map described above. Individual parts may then be categorized or "binned" for usability depending on the partial good status. For example, individual SoCs may be placed in different bins to be given different part numbers based on the partial goodness of the part reflected by the partial good status of the part and/or the characterization map.

FIG. 5 shows further detail for the SEEs 130A, 130B, 130C in each of the cores 120A, 120B, 120C shown in FIG. 1. The SEE 130A has a local signature register S1 510A that receives a signature from the self test 128A in Core1 120A as described above with reference to FIG. 1. The signature residing in S1 510A can be compared with a neighbor signature residing in the neighbor signature register NS1 512A. The result of the comparison of S1 510A and NS1 512A is stored in a results register 514A. Similarly, SEE 130B has a signature register S2 510B and a neighbor signature register NS2 512B that output a result to a result register 514B. SEE 130C has a signature register S3 510C and a neighbor signature register NS3 512C that output a result to a result register 514C. As introduced above, the SEE of each core connects to the SEE of neighboring cores in a loop connection 132 that allows the SEE to share a local core signature with the SEE of the other cores.

Again referring to FIG. 5, in a core centric compare individual core results are compared to other core results using registers connected between participating cores. A local signature in the local signature registers 510A, 510B, 510C can be serially shifted into the neighbor signature registers 512A, 512B, 512C. The SEE 130A can then use the loop connection 132 to load a signature from the left or the right neighbor. For example, if shifting left, the SEE 130A is loaded from SEE2 130B. And if shifting right, SEE 130A is loaded from SEE 130C. In this manner, the local signature of any neighboring core can be loaded into a neighbor signature register 512A, 512B, 512C and compared to the local signature in the local signature register 510A, 510B, 510C. The results from each of the compares in the compare range are stored in the results registers 514A, 514B, 514C. Each local core then uses the results of the comparisons to neighboring cores to determine a quality metrics or partial good value 516A, 516B, 516C for the core. For more robust results, a full compare can be done to compare local results with results from each of the other cores. Where less than full characterization is needed, various algorithms for a core centric compare can be used to determine the quality metrics using a variable number of compares and passes as described further below.

As introduced above, in a core centric compare, a core characterization signature is compared to the characterization signatures of a number of neighboring cores. The number of comparisons is the compare range. The range may be predefined in the SEE or may be programmable from the external tester 112 (FIG. 1). After the SEE compares the local characterization signature with that of all the cores in the compare range, the SEE can then evaluate the results with a threshold to determine if the local core is good or bad depending on a threshold. The threshold as defined for the examples herein is the maximum number of good matches that are allowed for a core having at least one mismatch to be declared as bad. Typically the threshold will be set to zero, meaning that any core with good comparisons will mean the core is marked as good and any core with all bad comparisons marked as bad. There is a risk that with a low threshold, some good comparisons are actually the result of comparing two cores with the same error giving the same bad characterization signature. This may happen in some cases where there are systematic problems that produce the same error. In such cases a higher threshold may be needed.

The SEE can evaluate the core in one or more passes of comparing the local characterization signature with the characterization signatures in neighboring cores. For multiple passes, the SEE may include logic to bypass comparisons with neighboring cores that did not meet the threshold for that pass. The number of passes may be one or more. In many cases a single pass is preferred. The number of passes may be preset or programmable from the external tester in the same manner as the compare range and the threshold.

Figure 6:
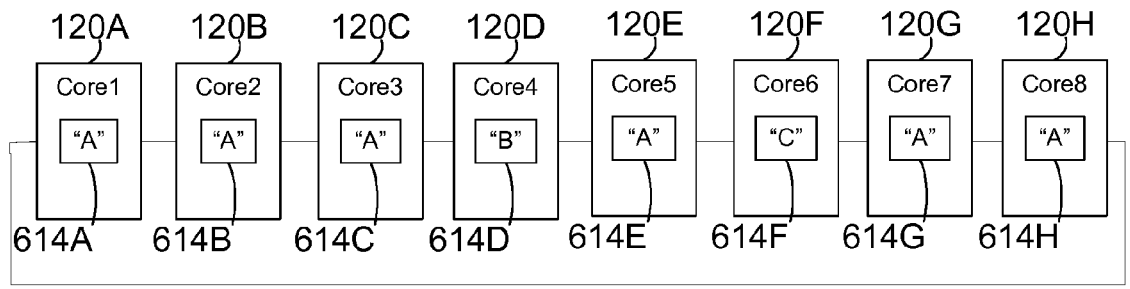
FIG. 6 illustrates a set of cores to illustrate an example for testing multiple cores on a SoC with the core centric compare in FIG. 5.

FIG. 6 illustrates a group of eight serially interconnected cores 120A-120H to illustrate an example of an algorithm for the SEE to determine the partial good status of the cores. Each core 120A-120H has associated with it a local signature produced by a local test and stored in the local signature registers 614A-614H. The local core signatures are represented in FIG. 6 by "A", "B", or "C" respectively in the local signature registers 614A-614H. In a Core Centric compare as described herein, each core shifts a selectable number of core signatures from other cores for comparison. Each core compares its' own local core signature to the core signatures shifted from the neighboring cores. A selectable number of passes can be performed, based on the level of detail that needs to be determined. Further each pass may compare the local core signature with one or more neighbors. A full comparison can be performed where every core signature is compared to all other core signatures, producing a full matrix of results. While this method produces a full characterization of the cores, it is time consuming and it is often only needed in a debug environment.

We will consider a specific example with reference to FIG. 6 and the following tables. In this example, we assume there are 8 cores, each with its' own internally generated signature as shown in FIG. 6. Each core will compare its own signature to the signature of four neighbors (in this example the prior 4 neighbors). In this example, two passes will be used to identify the valid cores. It should be noted that multiple core signatures can be valid, either because of mixed core types or other reasons. Using multiple passes and bypassing some results allow the cores to determine the core's goodness. The following table represents a single pass comparing each core in FIG. 6 to four prior cores. If there is a match, meaning the local core signature is the same as the shifted core signature, then a "match" is recorded. If they are different, then a "mismatch" is recorded in the table. Each row of the table holds the results of the all the comparisons in the compare range, thus each row in the table corresponds to the results register in the corresponding SEE shown in FIG. 5 and is shown here to illustrate the example of the SEE logic acting on the results to produce a goodness value for the core.

TABLE 1A

| Pass 1 | N − 1 | N − 2 | N − 3 | N − 4 |
|---|---|---|---|---|
| C1 (A) | match | match | mismatch | match |
| C2 (A) | match | match | match | mismatch |
| C3 (A) | match | match | match | match |
| C4 (B) | mismatch | mismatch | mismatch | mismatch |
| C5 (A) | mismatch | match | match | match |
| C6 (C) | mismatch | mismatch | mismatch | mismatch |
| C7 (A) | mismatch | match | mismatch | match |
| C8 (A) | match | mismatch | match | mismatch |

After the first pass, the results of the comparisons are as in Table 1. In subsequent passes, all cores that have mismatches per the threshold will be bypassed for the next pass. In the above example, if the threshold is set at 0, then cores C4 and C6 would be marked as bad and an additional pass would not be required. However if the failing threshold is 2, then C7 and C8 would also have been marked as bad. In this example we assume the number of passes is set at 2 and the threshold is 0, and another pass will be performed. In table 1A, it can be seen that cores C4 and C6 had all mismatched signatures and will be bypassed in the next pass shown in Table 1B.

TABLE 1B

| Pass 2 | N − 1 | N − 2 | N − 3 | N − 4 |
|---|---|---|---|---|
| C1 | match | match | match | match |
| C2 | match | match | match | match |
| C3 | match | match | match | match |
| C4 | | | | |
| C5 | match | match | match | match |
| C6 | | | | |
| C7 | match | match | match | match |
| C8 | match | match | match | match |

Table 1B shows the results of the compares after the second pass. From the data in Table 1B, the comparisons have identified 6 passing cores and 2 failing cores (C4 and C6). The SEE of each core will identify itself as passing (cores C1, C2, C3, C5, C7 and C8) or failing (C4 and C6) and generate a goodness value 516 (FIG. 5) for the core. This goodness value may then be gathered into the characterization map 126 (FIG. 1). The example is not meant to limit the number of core comparisons or number of passes, but to serve as a simple example. It is also well understood that comparing all cores in this example by setting a compare range of 8 and setting the correct failure threshold can accomplish in 1 pass the same results as 2 passes. However, for a large number of cores it would be costly to compare to all the cores.

We will consider a second example of a core centric compare. In this example, there are 12 cores, each with its' own internally generated signature similar to that shown in FIG. 6. However, in this example, the signatures in the 12 cores are as follows: A, A, A, B, A, C, A, A, D, D, E, D. In this example, each core will compare its own signature to the signature of the two previous and two following neighbors. In this manner a core will always compare to a neighbor and that neighbor also includes this core in its compare. In this example, the SEE is set to perform a single pass.

TABLE 2A

| Pass 1 | N − 2 | N − 1 | N + 1 | N + 2 |
|---|---|---|---|---|
| C1 (A) | mismatch | mismatch | match | match |
| C2 (A) | mismatch | match | match | mismatch |
| C3 (A) | match | match | mismatch | match |
| C4 (B) | mismatch | mismatch | mismatch | mismatch |
| C5 (A) | match | mismatch | mismatch | match |
| C6 (C) | mismatch | mismatch | mismatch | mismatch |
| C7 (A) | match | mismatch | match | mismatch |
| C8 (A) | mismatch | match | mismatch | mismatch |
| C9 (D) | mismatch | mismatch | match | mismatch |
| C10 (D) | mismatch | match | mismatch | match |
| C11 (E) | mismatch | mismatch | mismatch | mismatch |
| C12 (D) | match | mismatch | mismatch | mismatch |

After making the comparisons for the entire compare range, cores C4, C6 and C11 would each be identified as a bad cores, having matched 0 of 4 and thus failing the threshold set to 0. Note that if the threshold was set to 1 then cores C8, C9 and C12 would also have been marked as bad. These would be marked as bad even though others with the same characterization signature (D) are marked as good because there are multiple cores with the same characterization signature.

In the previous example, rather than moving the threshold to 1, a better approach would be to increase the compare range to 6. This would have continued to have cores C4, C6, and C11 identified as bad, but cores C8, C9 and C12 would have 2 matching flags so also pass a stricter threshold of 1. Conversely if the compare range was dropped to 2 then not only are C4, C6 and C11 marked as bad with a threshold of 0, but so are C5 and C12. Typically a threshold of 0 is sufficient to sort the good from the bad, as it is very unlikely that 2 bad cores will have the same signature. However the wider the compare range the more chances a core gets to find another that it matches and thus save it from being marked as bad. Eliminated Cores, cores marked as bad, could also be picked back up by a later step, by using every good proven passing signature to compare across the full range. However, that would better be accomplished by setting the compare range for the full width of the cores for a single first pass but at additional cost of time and testing resources.

Figure 7:
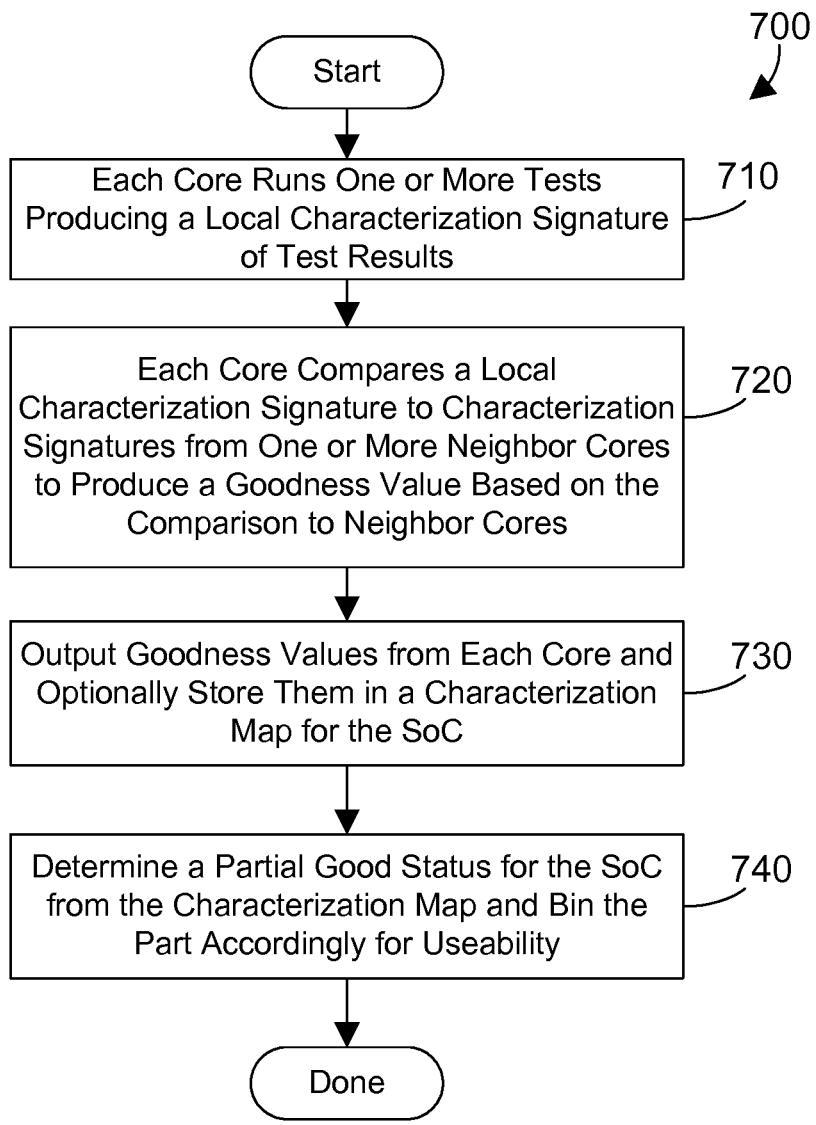
FIG. 7 is a flow diagram for a method for testing multiple cores on a SoC.

FIG. 7 is a flow diagram for a method 700 for validating an integrated circuit such as a SoC with multiple cores. Method 700 is preferably performed by a Self Evaluation Engine (SEE) to evaluate each of the multiple cores with metrics of goodness to create a partial good status for the SoC. Method 700 starts by each core running one or more tests to characterize the core and produce a local core characterization signature from the test results (step 710). Then each core compares a local core characterization signature to the core characterization signatures from one or more neighbor cores to produce a goodness value based on the comparison (step 720). Output partial goodness values from each cores and optionally store them in a characterization map (step 730). Determine a partial goodness status for the SoC from the partial goodness values in the characterization map and bin the part accordingly for usability (step 740). The method is then done.

Figure 8:
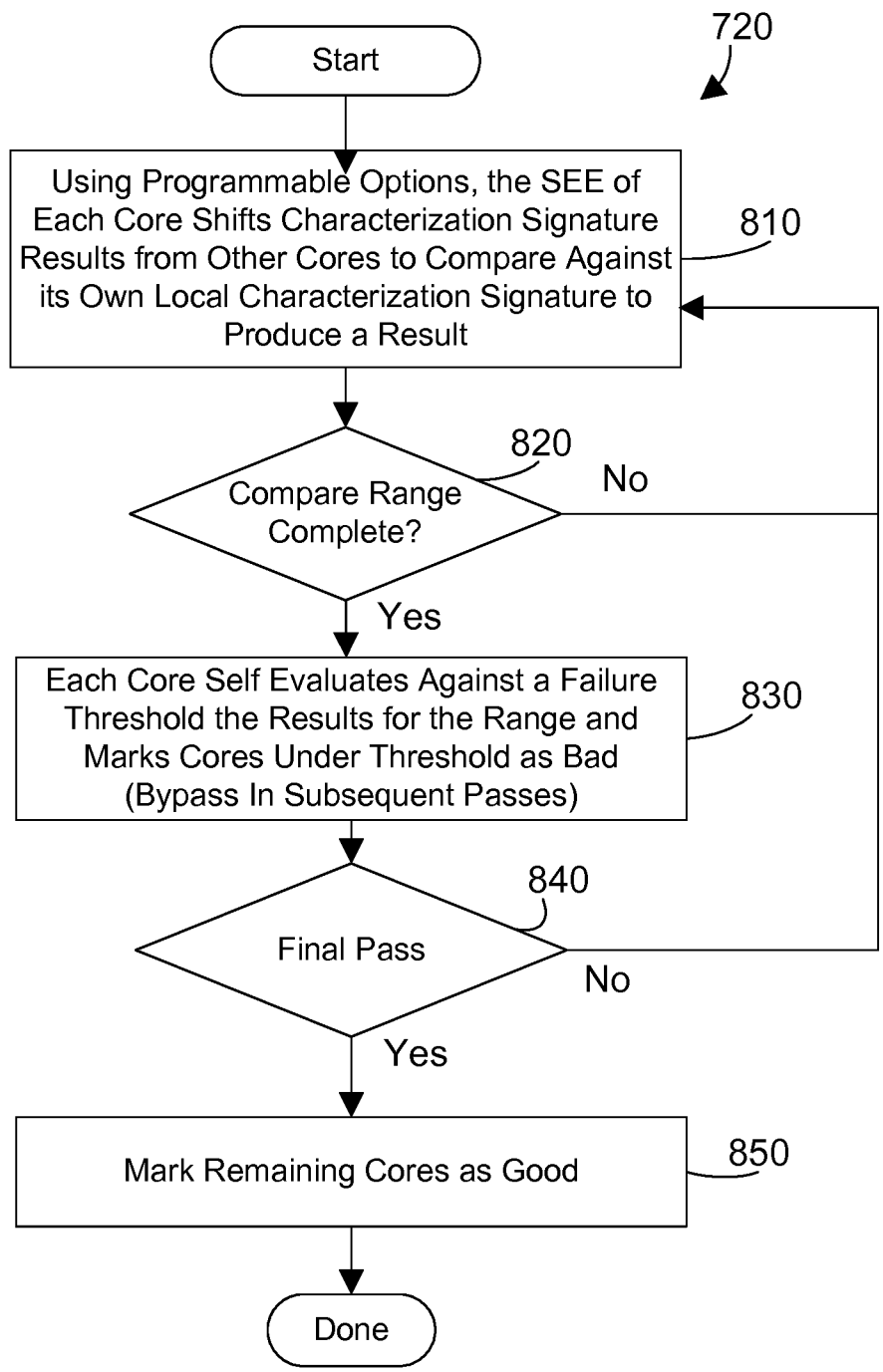
FIG. 8 is a flow diagram for a method for implementing step 720 in the flow diagram of FIG. 7.

FIG. 8 is a flow diagram for a method 720 for validating an integrated circuit such as a SoC with multiple cores. Method 720 is one possible method for implementing step 720 in FIG. 7. Method 720 is preferably performed by a Self Evaluation Engine (SEE) to evaluate each of the multiple cores with metrics of goodness to create a partial good status for the SoC. Method 720 starts by each core using programmable options to shift characterization signatures from another core to compare against its own local characterization signature and create a result (step 810). If the compare range is not complete (step 820=no), then return to step 810 for another iteration. If the compare range is complete (step 820=yes), then each core self evaluates against a failure threshold the results from the compare range and marks cores under the threshold as bad (to be bypassed in subsequent passes) (step 830). If the pass is not the final pass (step 840=no) then return to step 810. If the pass is the final pass (step 840=yes), then mark the remaining cores as "good" (step 850). The method is then done.

The described method and structure provides a cost effective and efficient way to test a SoC or other integrated circuit having multiple cores for partial good status. A Self Evaluation Engine (SEE) evaluates each of the multiple cores with metrics of goodness to create a partial good status for the SoC by comparing the characterization signature of a core with neighboring cores to determine a partial good value for the core.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An integrated circuit comprising:
   a plurality of cores wherein each of the plurality of cores is considered a local core with a plurality of neighboring cores, wherein each local core further comprises:
   a self test mechanism that executes at least one test on the local core and produces a local signature for the local core where the local signature characterizes the local core; and
   a self evaluation engine (SEE) that compares the local signature with a plurality of neighbor core signatures produced by the plurality of neighboring cores to determine a goodness value for the local core.

2. The integrated circuit of claim 1 wherein the SEE performs a parallel compare of the local signature with the plurality of neighbor core signatures produced by the plurality of neighboring cores.

3. The integrated circuit of claim 1 wherein the SEE performs a serial compare of the local signature with the plurality of neighbor core signatures produced by the plurality of neighboring cores.

4. The integrated circuit of claim 3 wherein the SEE performs a full serial compare of the local signature with the plurality of neighbor core signatures produced by the plurality of neighboring cores.

5. The integrated circuit of claim 4 wherein the SEE performs a core centric serial compare of the local signature by shifting a predefined number of neighbor core signatures produced from the plurality of neighboring cores and comparing the local core signature with the neighbor core signature to produce results for each compare.

6. The integrated circuit of claim 5 wherein the SEE evaluates the results for each compare against a threshold to determine a goodness value for the local core which is used to produce a partial good status for the integrated circuit.

7. The integrated circuit of claim 6 wherein the goodness values for all the cores in the integrated circuit are collected into a characterization map.

8. The integrated circuit of claim 5 wherein the SEE further performs the core centric serial compare in multiple passes and bypasses compares of local cores where a previous pass indicated mismatch compares exceeding a threshold.

9. The integrated circuit of claim 1 wherein the integrated circuit is a system on a chip (SoC) and the core is a microprocessor core.

10. An integrated circuit with a system on a chip (SoC) comprising:
    a plurality of microprocessor cores on the integrated circuit wherein each microprocessor core of the plurality of microprocessor cores is considered a local core with a plurality of neighboring cores, wherein each local core further comprises:
        a self test mechanism that executes at least one test on the local core and produces a local signature for the local core where the local signature characterizes the local core; and
        a self evaluation engine (SEE) that performs a core centric serial compare of the local signature by comparing the local signature with a pre-defined number of neighbor core signatures shifted from the plurality of neighboring cores to produce results for each compare, wherein the SEE evaluates the results for each compare against a threshold to determine a goodness value, wherein the goodness value for each of the plurality of cores is used to produce a partial good status for the integrated circuit.

11. The integrated circuit of claim 10 wherein the SEE performs the core centric compare in multiple passes and bypasses compares of local cores where a previous pass indicated mismatch compares exceeding a threshold.

12. An integrated circuit comprising:
    a plurality of cores wherein each of the plurality of cores is considered a local core with a plurality of neighboring cores, wherein each local core further comprises:
        a self test mechanism that executes at least one test on the local core and produces a local signature for the local core where the local signature characterizes the local core;
        a self evaluation engine (SEE) that compares the local signature with a plurality of neighbor core signatures produced by the plurality of neighboring cores to determine a goodness value for the local core; and
    wherein the SEE performs a parallel compare of the local signature with the plurality of neighbor core signatures produced by the plurality of neighboring cores.

13. The integrated circuit of claim 12 wherein the SEE performs a serial compare of the local signature with the plurality of neighbor core signatures produced by the plurality of neighboring cores.

14. The integrated circuit of claim 13 wherein the SEE performs a full serial compare of the local signature with the plurality of neighbor core signatures produced by the plurality of neighboring cores.

15. The integrated circuit of claim 14 wherein the SEE performs a core centric serial compare of the local signature by shifting a predefined number of neighbor core signatures produced from the plurality of neighboring cores and comparing the local core signature with the neighbor core signature to produce results for each compare.

16. The integrated circuit of claim 15 wherein the SEE evaluates the results for each compare against a threshold to determine a goodness value for the local core which is used to produce a partial good status for the integrated circuit.

17. The integrated circuit of claim 16 wherein the goodness values for all the cores in the integrated circuit are collected into a characterization map.

18. The integrated circuit of claim 15 wherein the SEE further performs the core centric serial compare in multiple passes and bypasses compares of local cores where a previous pass indicated mismatch compares exceeding a threshold.

19. The integrated circuit of claim 12 wherein the integrated circuit is a system on a chip (SoC) and the core is a microprocessor core.

* * * * *